(12) United States Patent
Fujiwara et al.

(10) Patent No.: US 6,746,913 B2
(45) Date of Patent: Jun. 8, 2004

(54) METHOD OF MANUFACTURING SEMICONDUCTOR INTEGRATED CIRCUIT DEVICE COMPRISING A MEMORY CELL AND A CAPACITOR

(75) Inventors: Tsuyoshi Fujiwara, Hamura (JP); Takeshi Saikawa, Ome (JP); Ryouichi Furukawa, Ome (JP); Masato Kunitomo, Ome (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/083,416

(22) Filed: Feb. 27, 2002

(65) Prior Publication Data

US 2003/0052353 A1 Mar. 20, 2003

(30) Foreign Application Priority Data

Sep. 19, 2001 (JP) .......................................... 2001-285248

(51) Int. Cl.⁷ .......................................... H01L 21/8242
(52) U.S. Cl. ........................ 438/253; 438/255; 438/260; 438/398
(58) Field of Search ................................ 438/253–255, 438/396–398

(56) References Cited

U.S. PATENT DOCUMENTS 5,763,306 A * 6/1998 Tsai ............................ 438/255
5,985,732 A * 11/1999 Fazan et al. ................. 438/398
6,589,839 B1 * 7/2003 Basceri et al. .............. 438/254

FOREIGN PATENT DOCUMENTS

JP 2000-22110 1/2000

* cited by examiner

Primary Examiner—Thanh Nguyen
(74) Attorney, Agent, or Firm—Miles & Stockbridge P.C.

(57) ABSTRACT

A silicon oxide film on which a capacitor of a semiconductor integrated circuit device is formed is formed by the plasma CVD method at a temperature of 450° C. to 700° C. In this semiconductor integrated circuit device, a memory cell formed of a MISFET for data transfer and a capacitor is formed in a memory cell forming area, and an n channel MISFET and a p channel MISFET constituting a logic circuit is formed in a logic circuit forming area. As a result, the amount of degassing from the silicon oxide film can be reduced. Therefore, the growth of silicon grains on a surface of the silicon film constituting a lower electrode of the capacitor is not hindered by the degassing, and it becomes possible to increase the capacitance. Also, the step of a heat treatment for removing the moisture and the like after forming the silicon oxide film can be omitted, and it becomes possible to prevent the deterioration of the property of the MISFET.

10 Claims, 15 Drawing Sheets

METHOD OF MANUFACTURING SEMICONDUCTOR INTEGRATED CIRCUIT DEVICE COMPRISING A MEMORY CELL AND A CAPACITOR

TECHNICAL FIELD OF THE INVENTION

The present invention relates to a semiconductor integrated circuit device and a manufacturing method of the same. More particularly, the present invention relates to a technique effectively applicable to a semiconductor integrated circuit device, in which a DRAM (Dynamic Random Access Memory) and a logic circuit are mounted together, and a manufacturing method of the same.

BACKGROUND OF THE INVENTION

The DRAM has a MISFET (Metal Insulator Semiconductor Field Effect Transistor) for data transfer and a capacitor for data storage connected in series to this MISFET. This capacitor for data storage is formed by, for example, sequentially depositing silicon to be a lower electrode, tantalum oxide to be a capacitor insulating film, and a refractory metal film to be an upper electrode.

Also, in this capacitor for data storage, the scaling down of the device and the increase of the capacitance thereof are achieved by forming a deep hole through the insulating film and then forming a lower electrode and a capacitor insulating film on the side wall and the bottom surface of the hole.

For further increase of the capacitance, a technique is employed in which projections made of silicon grains are provided on a surface of the silicon to be a lower electrode to create surface irregularities, and thereby increasing the surface area. The projections made of silicon grains are called HSG (Hemispherical Grained) silicon or rugged silicon.

A technique capable of effectively forming the HSG polysilicon is disclosed in, for example, Japanese Patent Application Laid-Open Publication No. 2000-22110. This technique is briefly described as follows: Moisture contained in an interlayer insulating film is desorbed and the desorbed moisture reacts to the polysilicon film below the interlayer insulating film during the high temperature heat treatment for forming the HSG polysilicon film. As a result, an $SiO_2$ film is formed on the surface of the polysilicon film. For its prevention, a heat treatment at a temperature higher than the temperature at which the moisture is desorbed is performed immediately before the above-described high temperature heat treatment.

SUMMARY OF THE INVENTION

Inventors of the present invention have been engaged in research and development of the DRAM and the like, and have been attempting to increase the capacitance by means of the introduction of the rugged polysilicon.

However, since the growth of the rugged polysilicon is hindered due to the effect of the moisture in the insulating film on which the rugged polysilicon is formed, it is difficult to obtain the sufficient surface area of the rugged polysilicon. Thus, such a method is under consideration that a high temperature heat treatment is performed to remove the moisture in the insulating film, and then, to have the rugged polysilicon grown. In this case, however, the properties of the MISFET in the under layer are deteriorated due to the high temperature heat treatment.

Especially, in the so-called system LSI (Large Scale Integrated Circuit) in which the DRAM and the logic LSI are formed on the same semiconductor substrate, the logic circuit is formed by appropriately combining an n channel MISFET and a p channel MISFET, and the properties of these MISFETs are deteriorated due to the high temperature heat treatment.

For example, in these MISFETs, a so-called dual gate structure is employed, in other words, an n type gate electrode is used as the gate electrode of the n type MISFET and a p type gate electrode is used as the gate electrode of the p type MISFET. This is because if an n type gate electrode is used as the gate electrode of the p type MISFET, the channel thereof is formed at the position apart from the substrate surface (embedded channel), and the control of the potential applied to the gate electrode becomes difficult.

However, boron (B) implanted to make the p type gate electrode is prone to diffuse (leak) by the heat treatment. If the boron is diffused into the semiconductor substrate through a gate insulating film, the concentration profile of the semiconductor substrate is changed, resulting in the deterioration of its properties (e.g., variation of the threshold voltage).

In addition to the concentration profile of the semiconductor substrate, the heat treatment causes an adverse effect on various properties of the MISFET such as the concentration profile of the source and drain regions of the MISFET.

It is an object of the present invention to reduce the load due to the heat treatment to a semiconductor integrated circuit device having a DRAM memory cell.

It is another object of the present invention to improve the properties of a DRAM memory cell.

It is another object of the present invention to improve the properties of a semiconductor integrated circuit device having a DRAM and a logic circuit constituted of an n channel MISFET and a p channel MISFET.

The above and other objects and novel characteristic of the present invention will be apparent from the descriptions and the accompanying drawings of this specification.

The typical ones of the inventions disclosed in this application will be briefly described as follows.

1. In an aspect of the manufacturing method of a semiconductor integrated circuit device according to the present invention, an insulating film is formed above a MISFET of a memory cell, which is formed of the MISFET and a capacitor formed on a main surface of a semiconductor substrate, by the plasma CVD method at a temperature of 450° C. to 700° C.; a trench is formed by etching the insulating film; and a silicon film is deposited on the insulating film and in the trench, and then, the silicon film on the insulating film is removed to form a lower electrode of the capacitor on the inner wall of the trench.

2. In another aspect of the manufacturing method of a semiconductor integrated circuit device according to the present invention, a first insulating film is deposited above a MISFET of a memory cell, which is formed of the MISFET and a capacitor formed on a main surface of a semiconductor substrate, at a predetermined temperature; a second insulating film is deposited on the first insulating film at a temperature higher than the predetermined temperature; a trench is formed by etching the first and second insulating films; and a silicon film is deposited on the second insulating film and in the trench, and then, the silicon film on the second insulating film is removed to form a lower electrode of the capacitor on the inner wall of the trench.

3. In another aspect of the manufacturing method of a semiconductor integrated circuit device according to the present invention, a MISFET is formed on a main surface of a semiconductor substrate; and then, an insulating film containing an impurity is formed above the MISFET by the plasma CVD method at a temperature of 450° C. to 700° C.

4. In another aspect of the manufacturing method of a semiconductor integrated circuit device according to the present invention, a MISFET is formed on a main surface of a semiconductor substrate; a first insulating film is deposited on the MISFET at a predetermined temperature and the surface of the first insulating film is planarized; and then a second insulating film containing an impurity is formed on the first insulating film at a temperature higher than the predetermined temperature.

5. In an aspect of the semiconductor integrated circuit device according to the present invention, the semiconductor integrated circuit device is provided with a MISFET formed on a main surface of a semiconductor substrate; and a capacitor connected in series to the MISFET, wherein the capacitor is provided with a lower electrode made of a silicon film, which is formed at a concave portion in a lamination layer of a first insulating film formed above the MISFET and a second insulating film formed on the first insulating film and having smaller impurity content than the first insulating film; a capacitor insulating film formed on the lower electrode; and an upper electrode formed of a conductive film formed on the capacitor insulating film.

6. In another aspect of the semiconductor integrated circuit device according to the present invention, the semiconductor integrated circuit device is provided with a MISFET formed on a main surface of a semiconductor substrate; and a capacitor connected in series to the MISFET, wherein the capacitor is provided with a lower electrode made of a silicon film, which is formed at a concave portion in a lamination layer of a first insulating film formed above the MISFET and a second insulating film which is thinner than the first insulating film and formed on the first insulating film; a capacitor insulating film formed on the lower electrode; and an upper electrode formed of a conductive film formed on the capacitor insulating film.

DESCRIPTION OF THE PREFERRED EMBODIMENTS

Hereinafter, embodiments of the present invention will be described based on the drawings. Note that components having the same function are denoted by the same reference symbol throughout the drawings for describing the embodiments, and the repetitive description thereof will be omitted.

(First Embodiment)

The manufacturing method of the DRAM in this embodiment will be described with reference to FIGS. 1 to 12 along with the process flow. Note that an area in which a DRAM memory cell is formed (memory cell forming area (MCFA)) is on the left side of each cross-sectional view showing the semiconductor substrate, and an area in which a logic circuit or the like of the DRAM is formed (logic circuit forming area (LCFA)) is on the right side of the same.

In this memory cell forming area, a memory cell constituted of a MISFET Qs for data transfer and a capacitor C for data storage is formed, and in this logic circuit forming area, an n channel MISFET Qn and a p channel MISFET Qp constituting a logic circuit are formed.

Figure 1:
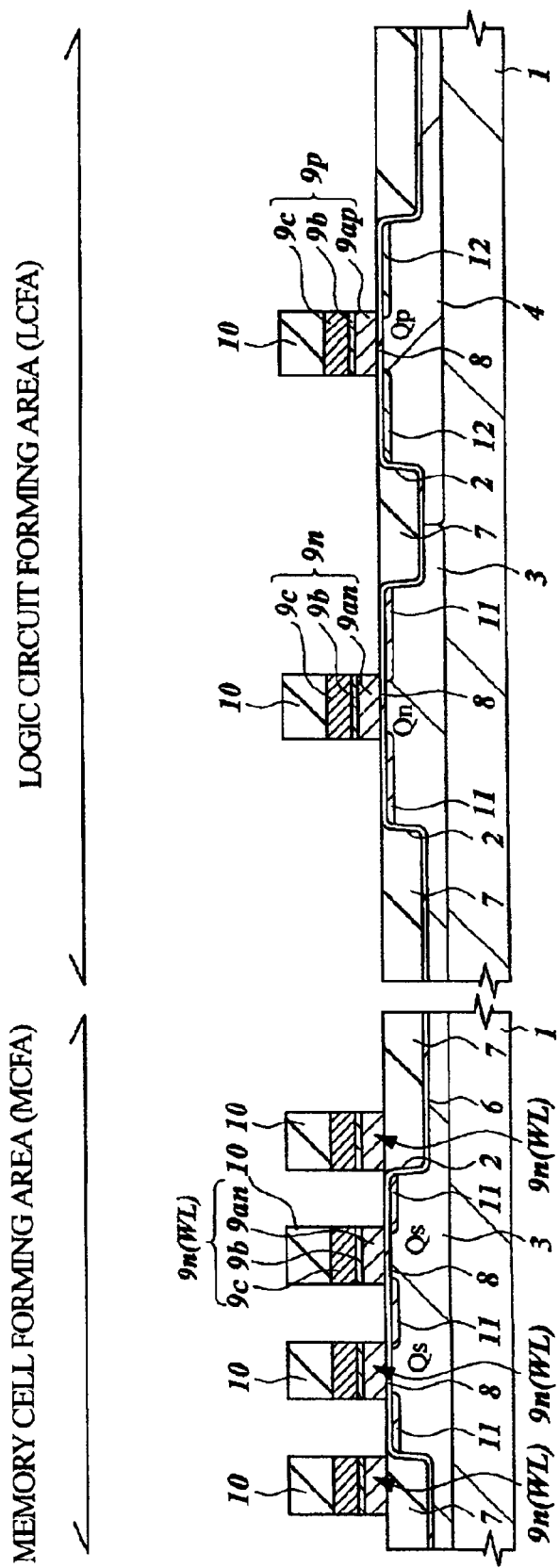
FIG. 1 is a cross-sectional view showing the principal part of a substrate illustrating a manufacturing method of a semiconductor integrated circuit device according to the first embodiment of the present invention.

First, as shown in FIG. 1, a semiconductor substrate 1 (hereinafter, referred to as a substrate) is etched to form a trench. Thereafter, a silicon oxide film 7 is embedded into this trench to form a device isolation 2. Next, after p type impurities (e.g., boron (B)) and n type impurities (e.g., phosphorus (P)) are ion-implanted into the substrate 1, the heat treatment is performed to diffuse these impurities, and thus, a P well 3 is formed on the substrate 1 in the memory cell forming area, and a P well 3 and an N well 4 are formed on the substrate 1 in the logic circuit forming area.

Next, for adjustment of the threshold voltages of the MISFET Qs for data transfer and the n channel MISFET Qn, impurities are ion-implanted into the P wells 3 on which these MISFETs are formed. Also, for adjustment of the threshold voltage of the p channel MISFET Qp, impurities are ion-implanted into the N well 4 on which these MISFETs are formed.

Next, the surface of the substrate 1 (P well 3 and N well 4) is wet cleaned with using cleaning liquid containing hydrofluoric acid. Thereafter, a clean gate oxide film 8 is formed on each of the surfaces of the P well 3 and the N well 4 by means of thermal oxidation.

Next, a low-resistance polycrystalline silicon film (9a) is deposited to a thickness of about 100 nm on the gate oxide film 8 by the CVD (Chemical Vapor Deposition) method. Subsequently, phosphorous (P) ions are implanted into the low-resistance polycrystalline silicon films on the P well 3 in the logic circuit forming area and the memory cell forming area, and thereby forming an n type low-resistance polycrystalline silicon film. Next, boron ions are implanted into the low-resistance polycrystalline silicon film on the N well 4 in the logic circuit forming area, and thereby forming a p type low-resistance polycrystalline silicon film. These n type and p type low-resistance polycrystalline silicon films are denoted by 9an and 9pn, respectively.

Subsequently, a WN film 9b having a thickness of about 5 nm and a W film 9c having a thickness of about 80 nm are deposited on the low-resistance polycrystalline silicon films (9an and 9ap) by the sputtering method, and further, a silicon nitride film 10 having a thickness of about 220 nm is deposited thereon by the CVD method.

Next, dry etching is performed to the silicon nitride film 10, the W film 9c, the WN film 9b, and the polycrystalline silicon films (9an and 9ap) with using a photoresist film (not shown and referred to as a resist film, hereinafter) as a mask, thereby forming an n type gate electrode 9n and a p type gate electrode 9p. More specifically, the p type gate electrode 9p is formed on the N well 4 in the memory cell forming area, and the n type gate electrode 9n is formed on each of the P well 3 in the memory cell forming area and the P well 3 in the logic circuit forming area. This n type gate electrode 9n is constituted of the n type polycrystalline silicon film 9n, the WN film 9b, and the W film 9c, and the p type gate electrode 9p is constituted of the p type polycrystalline silicon film 9ap, the WN film 9b, and the W film 9c. Also, a cap insulating film made of the silicon nitride film 10 is formed on each of these gate electrodes 9n and 9p. Note that the gate electrode 9n formed in the memory cell forming area functions as a word line WL.

Next, phosphorus ions are implanted into the both sides below the gate electrodes 9n in the memory cell forming area and the logic circuit forming area, thereby forming n$^-$ type semiconductor regions 11. Subsequently, boron fluoride (BF) ions are implanted into the both sides below the gate electrode 9p on the N well 4 in the logic circuit forming area, thereby forming p$^-$ type semiconductor regions 12.

Figure 2:
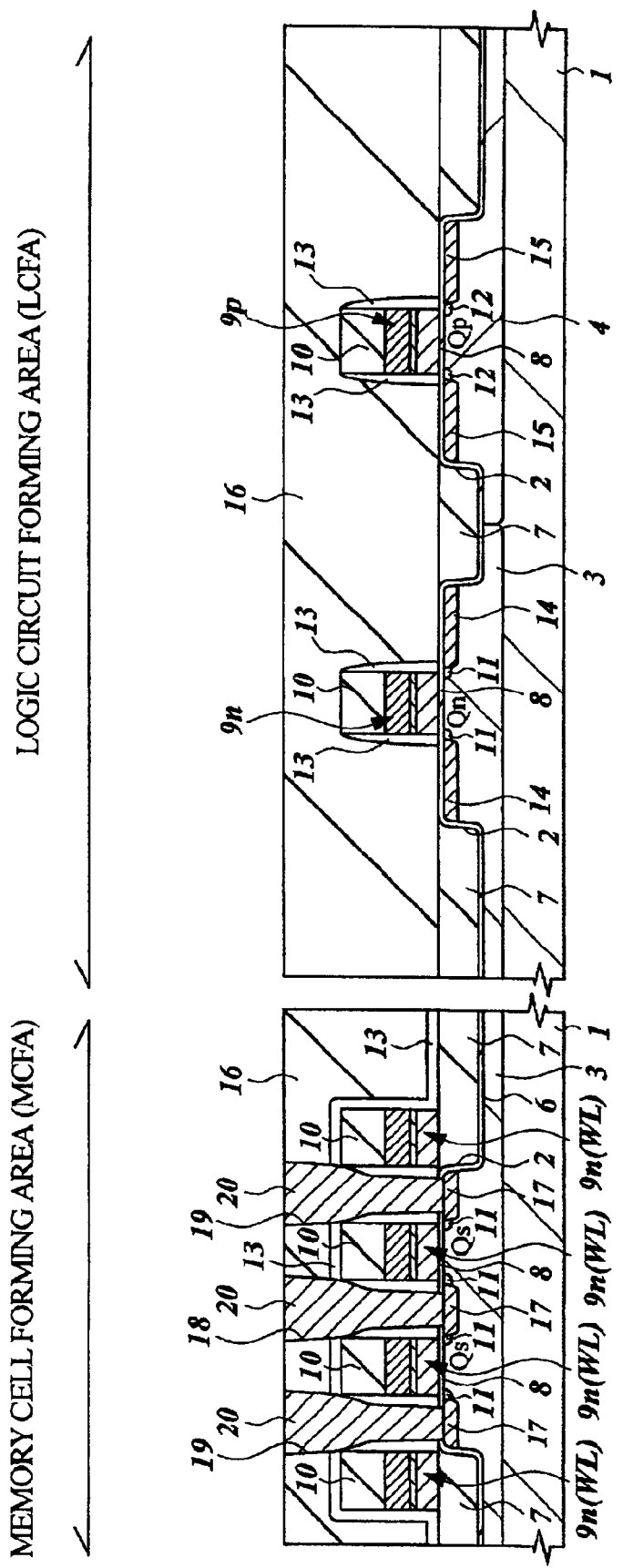
FIG. 2 is a cross-sectional view showing the principal part of the substrate illustrating the manufacturing method of a semiconductor integrated circuit device according to the first embodiment of the present invention.

Next, as shown in FIG. 2, a silicon nitride film 13 is deposited to a thickness of about 50 nm on the resultant structure on the substrate 1 by the CVD method. Thereafter, the upper portion of the substrate 1 in the memory cell forming area is covered with a resist film (not shown), and anisotropic etching is performed to the silicon nitride film 13 in the logic circuit forming area, thereby forming a sidewall spacer on the sidewall of each of the gate electrodes 9n and 9p in the logic circuit forming area.

Next, arsenic (As) ions are implanted into the both sides below the gate electrodes 9n on the P well 3 in the logic circuit forming area, thereby forming n$^+$ type semiconductor region 14 (source and drain). Subsequently, boron fluoride (BF) ions are implanted into the both sides below the gate electrode 9p on the N well 4 in the logic circuit forming area, thereby forming a p$^+$ type semiconductor region 15 (source and drain).

At the end of the steps described above, the n channel MISFET Qn and the p channel MISFET Qp, each of which is provided with a source and a drain (n$^-$ type semiconductor region 11 and n$^+$ type semiconductor region 14, and p$^-$ type semiconductor region 12 and p$^+$ type semiconductor region 15) having LDD (Lightly Doped Drain) structure, are formed in the logic circuit forming area, and the MISFET Qs for data transfer constituted of the n channel MISFET is formed in the memory cell forming area.

As described above, if the n type gate electrode 9n is used as the gate electrode of the n channel MISFET Qn in the logic circuit forming area and the p type gate electrode 9p is used as the gate electrode of the p channel MISFET Qp (so-called a dual gate structure), the channel is formed on the surface of the substrate, and thus, the subthreshold characteristics and the short channel effect can be improved.

Next, after forming a silicon oxide film 16 over the gate electrodes 9n and 9p, the silicon oxide film 16 on the n$^-$ type semiconductor region 11 in the memory cell forming area is dry-etched with using a resist film (not shown) as a mask to expose the surface of the silicon nitride film 13. Thereafter, the exposed silicon nitride film 13 is dry-etched to form contact holes 18 and 19 on the n$^-$ type semiconductor regions 11.

Next, arsenic (As) ions are implanted through the contact holes 18 and 19 to form an n$^+$ type semiconductor region 17. Subsequently, a plug 20 is formed in each of the contact holes 18 and 19. The plug 20 is formed in such a manner as follows. That is, a low-resistance polycrystalline silicon film in which n type impurities such as phosphorus (P) are doped is deposited on the silicon oxide film 16 and in the contact holes 18 and 19 by the CVD method, and subsequently, the polycrystalline silicon film is polished by the CMP (Chemical Mechanical Polishing) method so as to leave the polycrystalline silicon film only in the contact holes 18 and 19.

Figure 3:
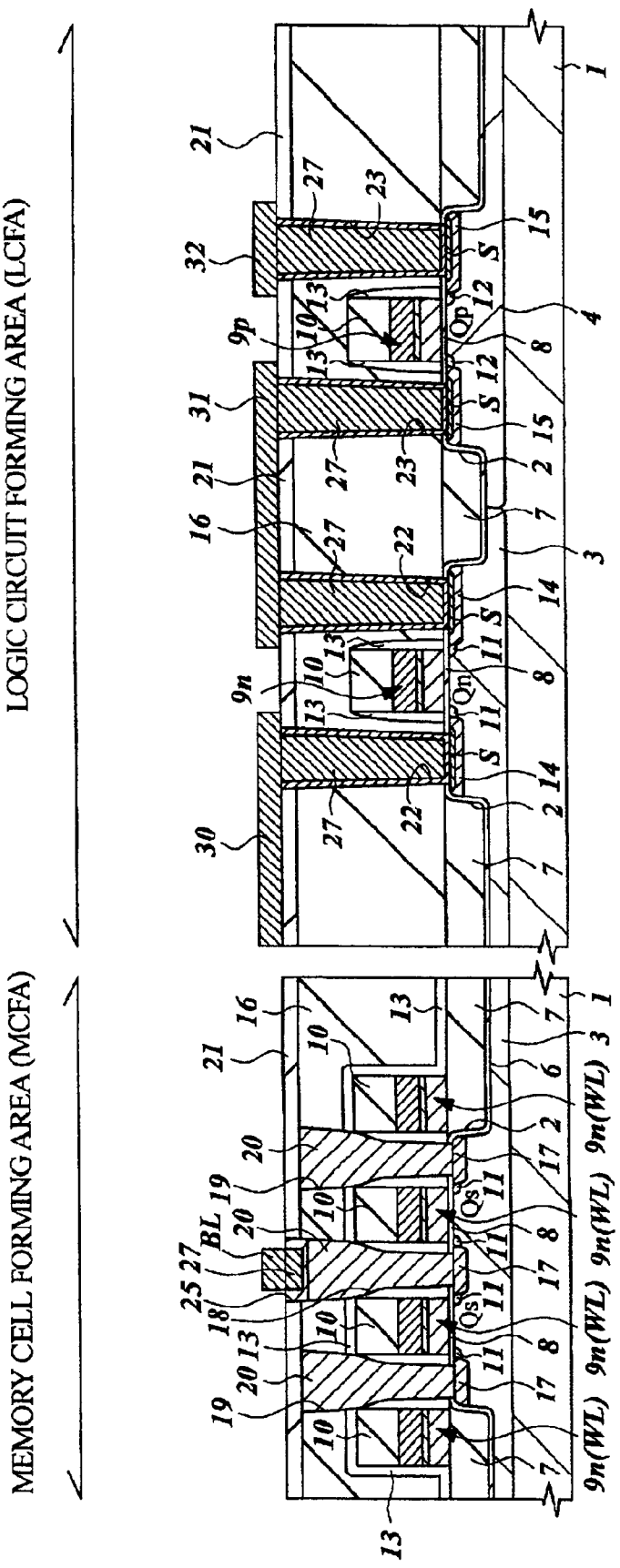
FIG. 3 is a cross-sectional view showing the principal part of the substrate illustrating the manufacturing method of a semiconductor integrated circuit device according to the first embodiment of the present invention.

Next, as shown in FIG. 3, after depositing a silicon oxide film 21 to a thickness of about 20 nm on the silicon oxide film 16 by the CVD method, the silicon oxide film 21 and the silicon oxide film 16 below it in the logic circuit forming area are dry-etched with using a resist film (not shown) as a mask. By so doing, contact holes 22 are formed on the n$^+$ type semiconductor region 14 of the n channel MISFET Qn, and contact holes 23 are formed on the p$^+$ type semiconductor region 15 of the p channel MISFET Qp. Simultaneous with this, a through hole 25 is also formed on the plug 20 formed inside the contact hole 18 in the memory cell forming area.

Subsequently, a cobalt (Co) film is deposited on the silicon oxide film 16 and in the contact holes 22 and 23 in the logic circuit forming area by the sputtering method, and a cobalt silicide (CoSi) layer S is formed by the silicidation reaction at a contact point between the Co film and the n$^+$ type semiconductor region 14 and the p+ type semiconductor region 15 in the logic circuit forming area. And then, the unreacted Co film is removed.

The silicide layer S is formed on the source and drain regions (n+ semiconductor region 14 and p+ semiconductor region 15) of the MISFET in the logic circuit forming area as described above, which makes it possible to reduce the contact resistance between a plug 27 described later and the source and drain regions. Therefore, it becomes possible to achieve higher operation speed of the logic circuit constituted of the MISFETs.

Next, the plugs 27 are formed in the contact holes 22 and 23 and in the through hole 25. This plug 27 is formed in such a manner as follows. That is, after a thin TiN film is deposited on the silicon oxide film 21, in the contact holes 22 and 23, and in the through hole 25 by the CVD method, a W film is deposited thereon, and then, the W film and the TiN film on the silicon oxide film 21 are polished by the CMP method to leave these films only in the contact holes 22 and 23 and in the through hole 25.

Next, a bit line BL is formed on the silicon oxide film 21 in the memory cell area, and first wirings 30 to 32 are formed on the silicon oxide film 21 in the logic circuit forming area. The bit line BL and the first wirings 30 to 32 are formed in such a manner as follows. That is, after depositing a W film on the silicon oxide film 21 by the sputtering method, the W film is dry-etched with using a resist film as a mask.

Figure 4:
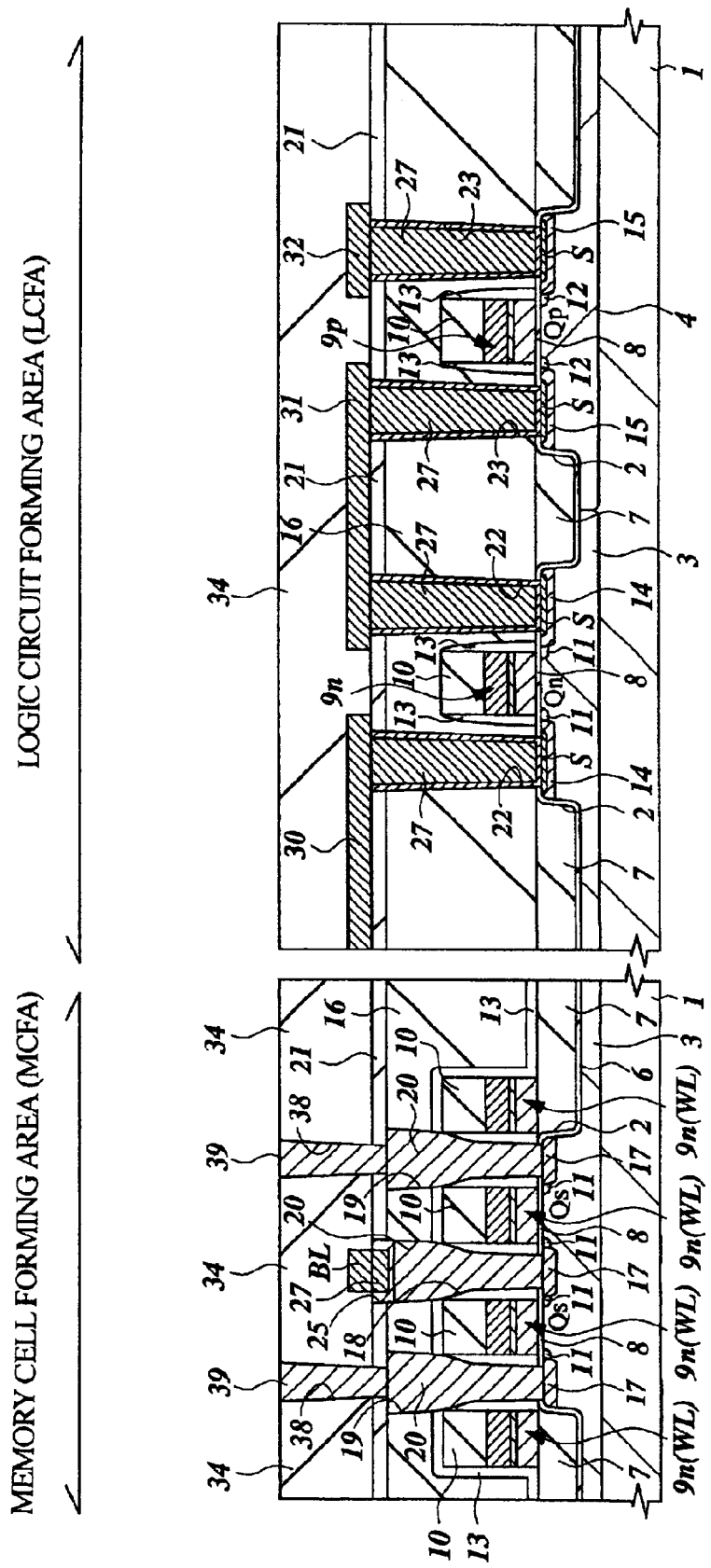
FIG. 4 is a cross-sectional view showing the principal part of the substrate illustrating the manufacturing method of a semiconductor integrated circuit device according to the first embodiment of the present invention.

Next, as shown in FIG. 4, a silicon oxide film 34 is formed on the bit line BL and the first wirings 30 to 32.

Next, the silicon oxide film 34 and the silicon oxide film 21 below it in the memory cell forming area are dry-etched to form a through hole 38 on the plug 20 in the contact hole 19.

Next, a plug 39 is formed in the through hole 38. The plug 39 is formed in such a manner as follows. That is, after depositing a low-resistance polycrystalline silicon film which is doped with n type impurities (e.g., phosphorus) on the silicon oxide film 34 and in the through hole 38, the polycrystalline silicon film is polished by the CMP method so as to leave the polycrystalline silicon film only in the through hole 38.

Figure 5:
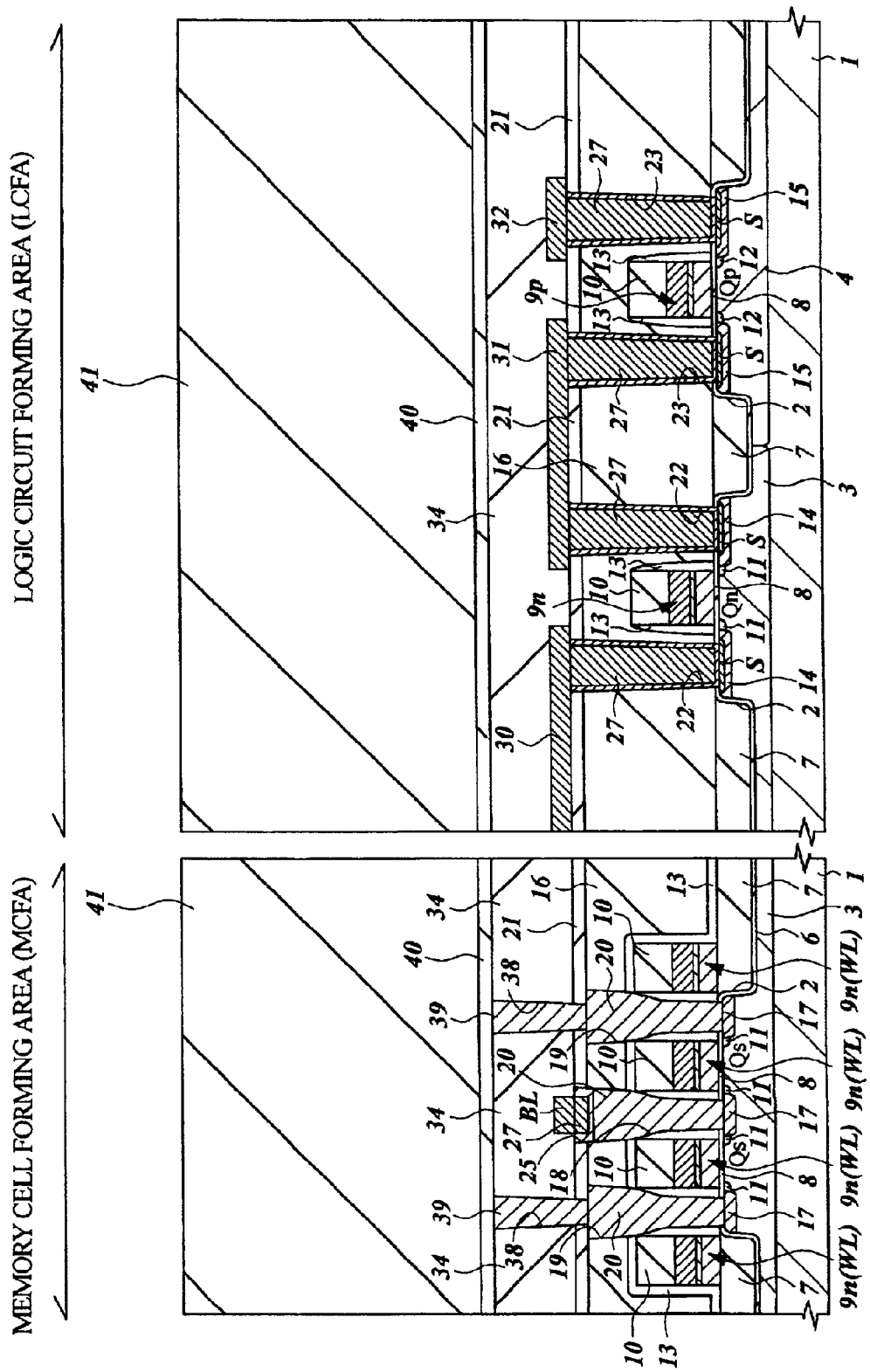
FIG. 5 is a cross-sectional view showing the principal part of the substrate illustrating the manufacturing method of a semiconductor integrated circuit device according to the first embodiment of the present invention.

Next, as shown in FIG. 5, a silicon nitride film 40 is deposited to a thickness of about 100 nm on the silicon oxide film 34 and the plug 39 by the CVD method, and subsequently, a silicon oxide film 41 is deposited to a thickness of about 1.4 μm on the silicon nitride film 40 by the CVD method.

The silicon oxide film 41 is formed by the high-density plasma CVD method with using monosilane ($SiH_4$) and oxygen as materials. The deposition temperature (substrate temperature) at this time is set in a range of 450° C. to 700° C.

In this embodiment, the silicon oxide film 41 having a capacitor C formed on the surface thereof is formed by the plasma CVD method at a high temperature of 450° C. to 700° C. as described above. Therefore, it is possible to form the silicon oxide film 41 having low moisture and impurity contents. The impurity mentioned here is a by-product material created during the film formation (gas-phase reaction).

In addition to monosilane, for example, tetraethoxysilane (TEOS) can also be used as a material thereof. If tetraethoxysilane is used, carbon and carbon compound are created as by-product materials. Note that the high-density plasma CVD method is employed in this embodiment, however, the regular plasma CVD method can also be used if the process temperature is set in a range of 450° C. to 700° C.

The high-density plasma CVD method is the CVD performed in a low-pressure atmosphere having a high electron density. More specifically, the regular plasma CVD is performed at a pressure of 1 to 10 Torr and an electron density of $1 \times 10^9$ to $1 \times 10^{10}$. On the other hand, the high-density plasma CVD is performed at a pressure of 0.001 to 0.01 Torr (1 Torr=$1.33322 \times 10^2$ Pa) and an electron density of $1 \times 10^{12}$ or more. Also, in the high-density plasma CVD method, the number of ions striking the substrate can be adjusted by controlling the current applied to the substrate, and thus, it is possible to control the substrate temperature easily.

Figure 6:
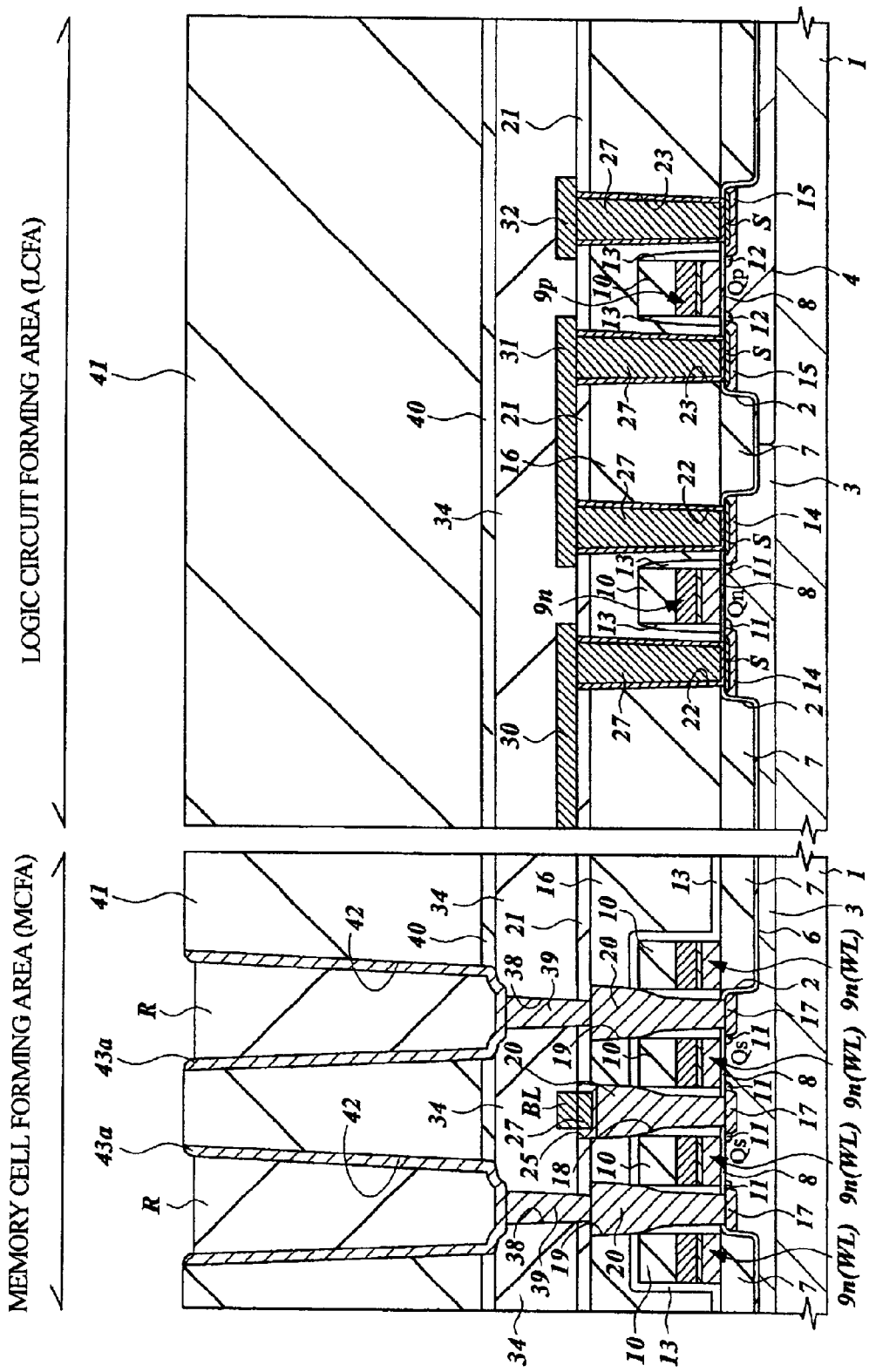
FIG. 6 is a cross-sectional view showing the principal part of the substrate illustrating the manufacturing method of a semiconductor integrated circuit device according to the first embodiment of the present invention.

Next, as shown in FIG. 6, the silicon oxide film 41 in the memory cell forming area is dry-etched with using a resist film (not shown) as a mask, and subsequently, the silicon nitride film 40 below the silicon oxide film 41 is dry-etched to form a trench 42 on each of the plugs 39.

Next, after depositing an amorphous silicon film 43a which is doped with n type impurities (phosphorus) to a thickness of about 50 nm on the silicon oxide film 41 and in the trenches 42, a resist film R is embedded to the trenches 42, and then, the amorphous silicon film 43a on the silicon oxide film 41 is etched back, thereby leaving the amorphous silicon film 43a on the inner wall of the trench 42.

Figure 7:
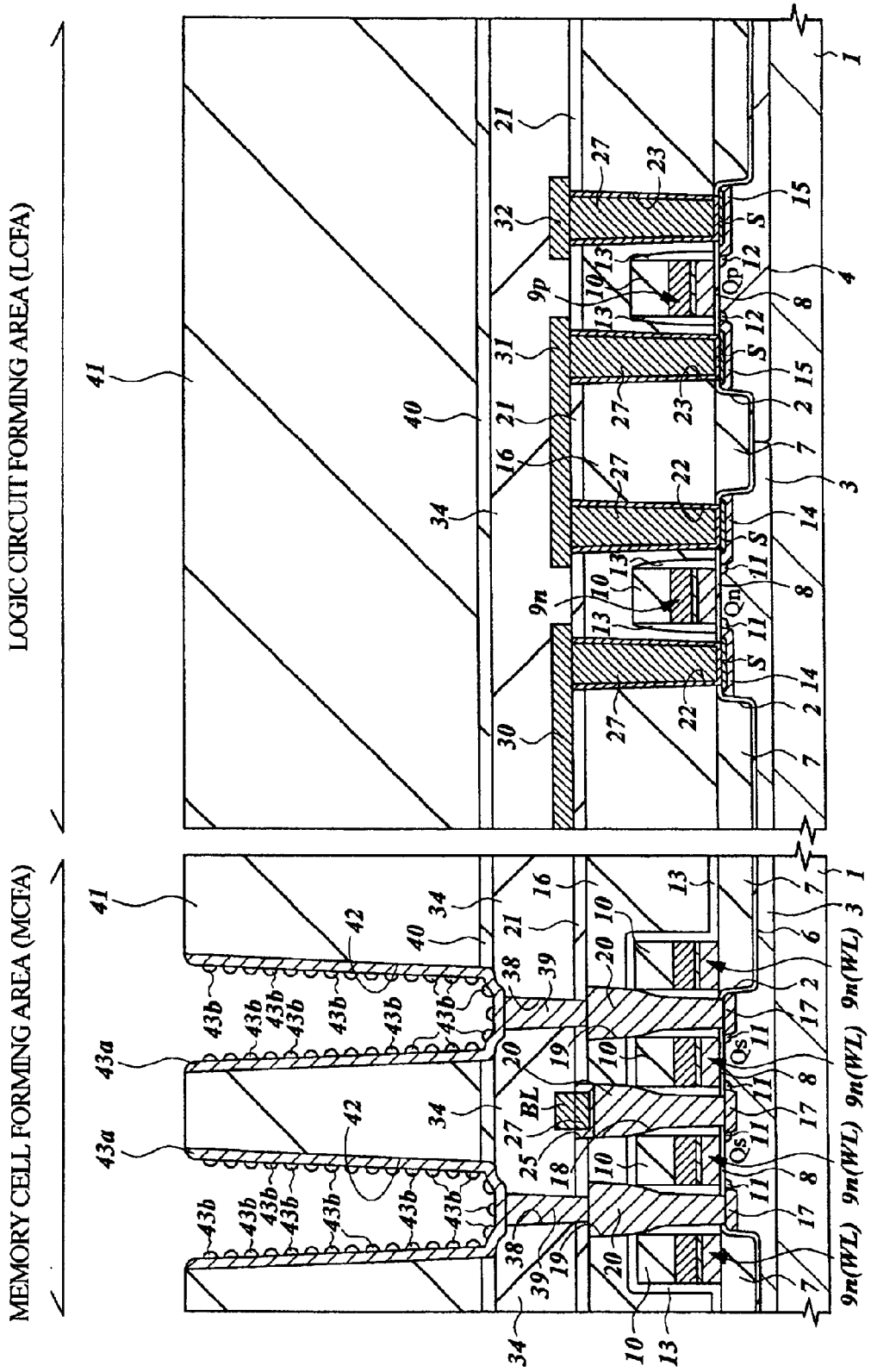
FIG. 7 is a cross-sectional view showing the principal part of the substrate illustrating the manufacturing method of a semiconductor integrated circuit device according to the first embodiment of the present invention.

Next, after removing the resist film R, the surface of the amorphous silicon film 43a left in the trench 42 is wet cleaned with using cleansing liquid containing hydrofluoric acid. Thereafter, as shown in FIG. 7, monosilane ($SiH_4$) is supplied to the surface of the amorphous silicon film 43a in the low-pressure atmosphere. Subsequently, a heat treatment is performed to the substrate 1 at a temperature of about 600° C. to polycrystallize the amorphous silicon film 43a, and thereby silicon grains 43b are grown on the surface of the amorphous silicon film 43a. Consequently, a polycrystalline silicon film 43 (43a and 43b) having irregularities on its surface is formed on the inner wall of the trench 42. The polycrystalline silicon film 43 is used as a lower electrode of the capacitor C.

As described above, the silicon oxide film 41 is formed by the plasma CVD method at a high temperature of 450° C. to 700° C., and thereby, the silicon oxide film 41 having low moisture and impurity contents is formed in this embodiment. Therefore, it is possible to reduce the amount of degassing from the silicon oxide film 41 when the silicon grains are grown. As a result, since such gas does not hinder the growth of the silicon grains and the supply of monosilane serving as a material of the silicon grains, it is possible to obtain sufficient surface area of the polycrystalline silicon film 43.

More specifically, if the silicon oxide film 41 is formed by the CVD method at a temperature of 400° C. or less, the degassing from the silicon oxide film 41 hinders the growth of the silicon grains and the supply of monosilane serving as a material of the silicon grains when the silicon grains are grown. Therefore, the surface area of the polycrystalline silicon film 43 can not be obtained sufficiently.

In addition, it would be possible to remove the moisture and impurities contained in the silicon oxide film 41 by performing a heat treatment after forming the silicon oxide film 41 and before forming the amorphous silicon film 43a in order to reduce the degassing from the silicon oxide film 41. However, in such a case where the silicon oxide film has already been formed thickly, the heat treatment must be performed at a considerably high temperature and for a long time (e.g., 750° C. and two minutes).

If the heat treatment at high temperature and for a long time like this is performed, the properties of the MISFETs Qs, Qn, and Qp are deteriorated. More specifically, the concentration profiles of the semiconductor regions constituting the source and drain of these MISFETs are changed, and as a result, it becomes impossible to maintain the desired properties.

Also, in the case where the MISFET of dual gate structure is formed in the logic circuit forming area, the impurities in the gate electrode may be diffused into the substrate through the gate insulating film. Especially, boron (B) implanted into the p type gate electrode is prone to be diffuse (leak), and the properties thereof are deteriorated easily.

Also, in such a case where a resistor device constituted of a polycrystalline silicon film and whose resistance value is controlled by the impurity concentration in the film is formed in addition to the MISFETs, the diffusion of the impurities in the film causes the resistance value to change.

Also, since such leakage of the impurities occurs irregularly in each device, it is quite difficult to implant impurities in consideration of the leakage amount in advance.

To the contrary, since the silicon oxide film 41 is formed by the plasma CVD method at a high temperature of 450° C. to 700° C. in this embodiment, the moisture and impurities can be removed during the film formation, and also, the heat treatment step to remove the moisture or the like after forming the silicon oxide film 41 can be omitted. In other words, it becomes possible to reduce the amount of time required for the heat treatment and to lower the temperature of the heat treatment.

Thus, since the heat load can be reduced, it is possible to prevent the deterioration of the properties of the MISFET, particularly, to reduce the leakage amount of boron.

Also, the reduction of the heat load makes it possible to prevent the wiring such as the bit line BL and first wirings 30 to 32 from peeling and breaking.

Note that, as described above, since the silicon grains 43b are grown at a temperature of 600° C. in this embodiment, if the silicon oxide film 41 is formed at a temperature of 600° C. or more, the further reduction of the degassing amount during the growth of the silicon grains can be achieved.

Figure 8:
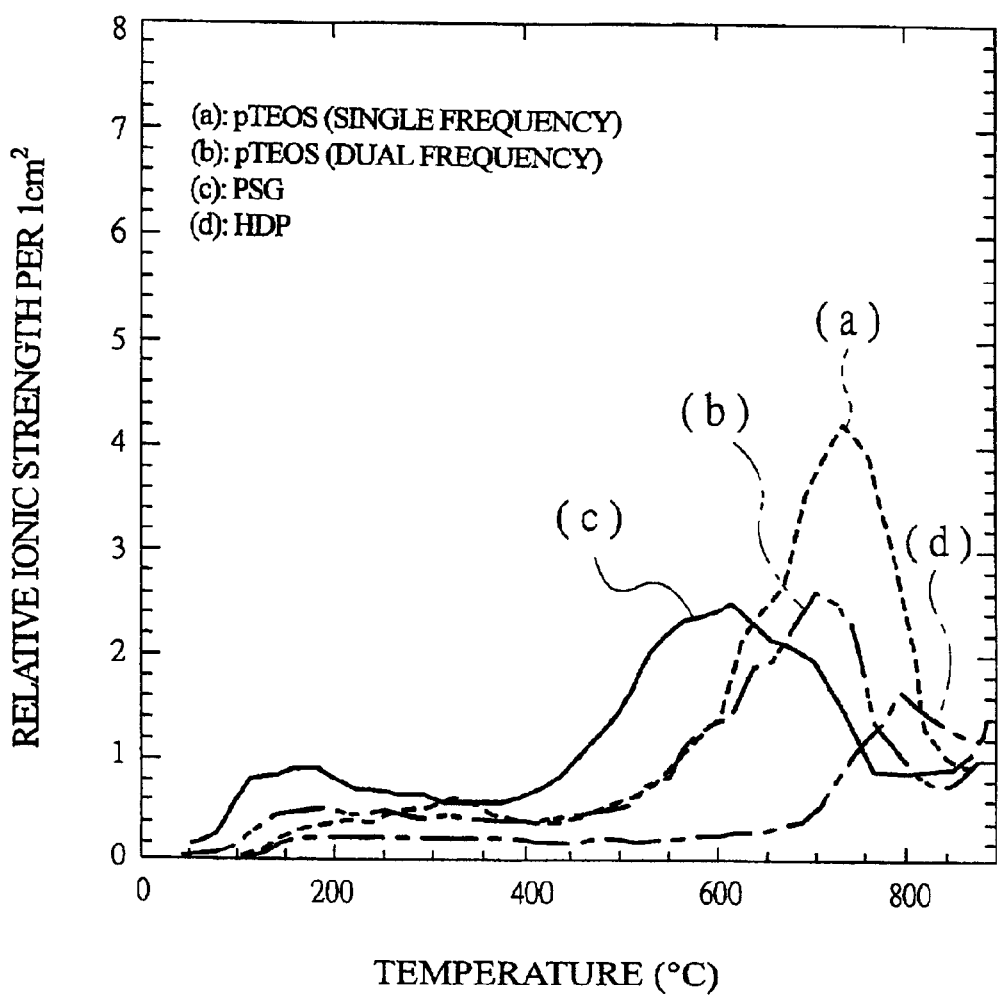
FIG. 8 shows graphs for explaining the results obtained in the embodiment of the present invention.

FIG. 8 shows the moisture desorption properties of the silicon oxide films formed under various conditions below based on the TDS (Thermal desorption spectroscopy) analysis. That is, (a): the plasma CVD method is used, the temperature is set at 400° C., and tetraethoxysilane is used as a material thereof, (b): the plasma CVD method in which two plasmas of high and low frequencies are used, the temperature is set at 400° C., and tetraethoxysilane is used as a material thereof, (c): the plasma CVD method is used, the temperature is set at 400° C., and gas containing tetraethoxysilane and phosphorus is used as a material thereof, and (d): the high-density plasma CVD method is used, the temperature is set at 600° C., and monosilane is used as a material thereof. The vertical axis in FIG. 8 represents the relative ionic ($H_2O$) strength per 1 $cm^2$, and when the amount of desorbed moisture is large, the value is also large. Also, the horizontal axis represents the temperature. In the graph (a), the amount of the desorbed moisture starts to increase at around the temperature over 600° C. and reaches its peak at around the temperature of 700° C. On the other hand, in the graph (d), the amount of the desorbed moisture starts to increase at around the temperature over 700° C. and reaches its peak at around the temperature of 800° C. However, the amount in this case is considerably smaller in comparison to the case of the graph (a). Note that as shown in the graph (b), in the case where the silicon oxide film is formed by using the two plasmas of high and low frequencies, the moisture desorption is improved in comparison to the case of the graph (a). Also, as shown in the graph (c), in the case where impurities (phosphorus) is contained in the silicon oxide film, the moisture desorption is found at a lower temperature.

Figure 9:
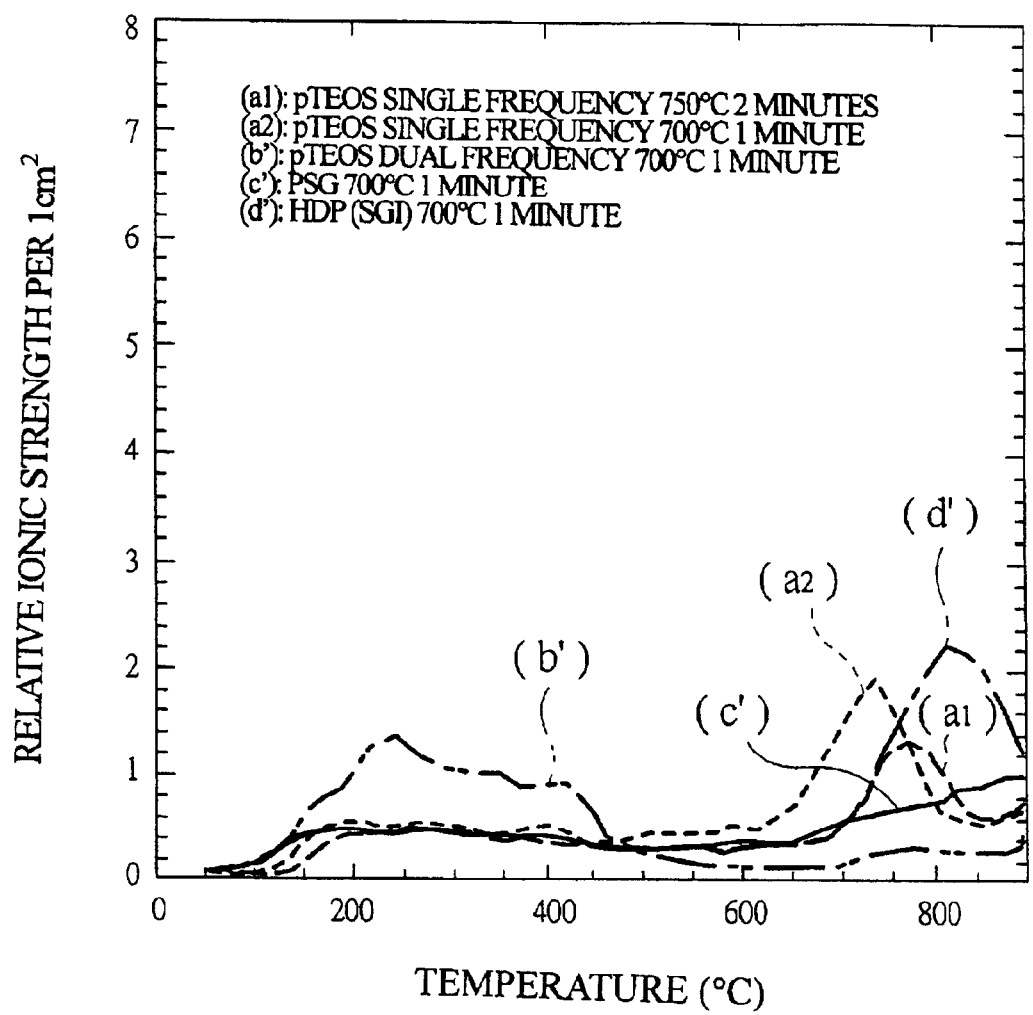
FIG. 9 shows graphs for explaining the results obtained in the embodiment of the present invention.

FIG. 9 shows the moisture desorption properties of each silicon oxide film shown in FIG. 8 after a heat treatment. The graph (a1) represents the moisture desorption property in the case where the silicon oxide film of the graph (a) is subjected to the heat treatment at 750° C. for 2 minutes, the graph (a2) represents the moisture desorption property in the case where the silicon oxide film of the graph (a) is subjected to the heat treatment at 700° C. for 1 minute, the graph (b') represents the moisture desorption property in the case where the silicon oxide film of the graph (b) is subjected to the heat treatment at 700° C. for 1 minute, the graph (c') represents the moisture desorption property in the case where the silicon oxide film of the graph (c) is subjected to the heat treatment at 700° C. for 1 minute, and the graph (d') represents the moisture desorption property in the case where the silicon oxide film of the graph (d) is subjected to the heat treatment at 700° C. for 1 minute. As shown in the graphs (a1) and (a2), the amount of the desorbed moisture is reduced after performing the heat treatment to the film of the graph (a) (refer to the graph (a) in FIG. 8). Also, as is apparent from the comparison of the graphs (a1) and (a2), the amount of the desorbed moisture in the film becomes smaller if the film is subjected to the heat treatment at higher temperature and for a longer time. Also, in the graphs (b') and (c'), the amount of the desorbed moisture is reduced after performing the heat treatment. On the other hand, as is apparent from the comparison of the graphs (d') and (d) in FIG. 8, the amount of the desorbed moisture in the film formed according to the conditions shown in this embodiment is not reduced even if the film is subjected to the subsequent heat treatment. This is considered because the moisture in the film is sufficiently removed during the film formation.

Figure 10:
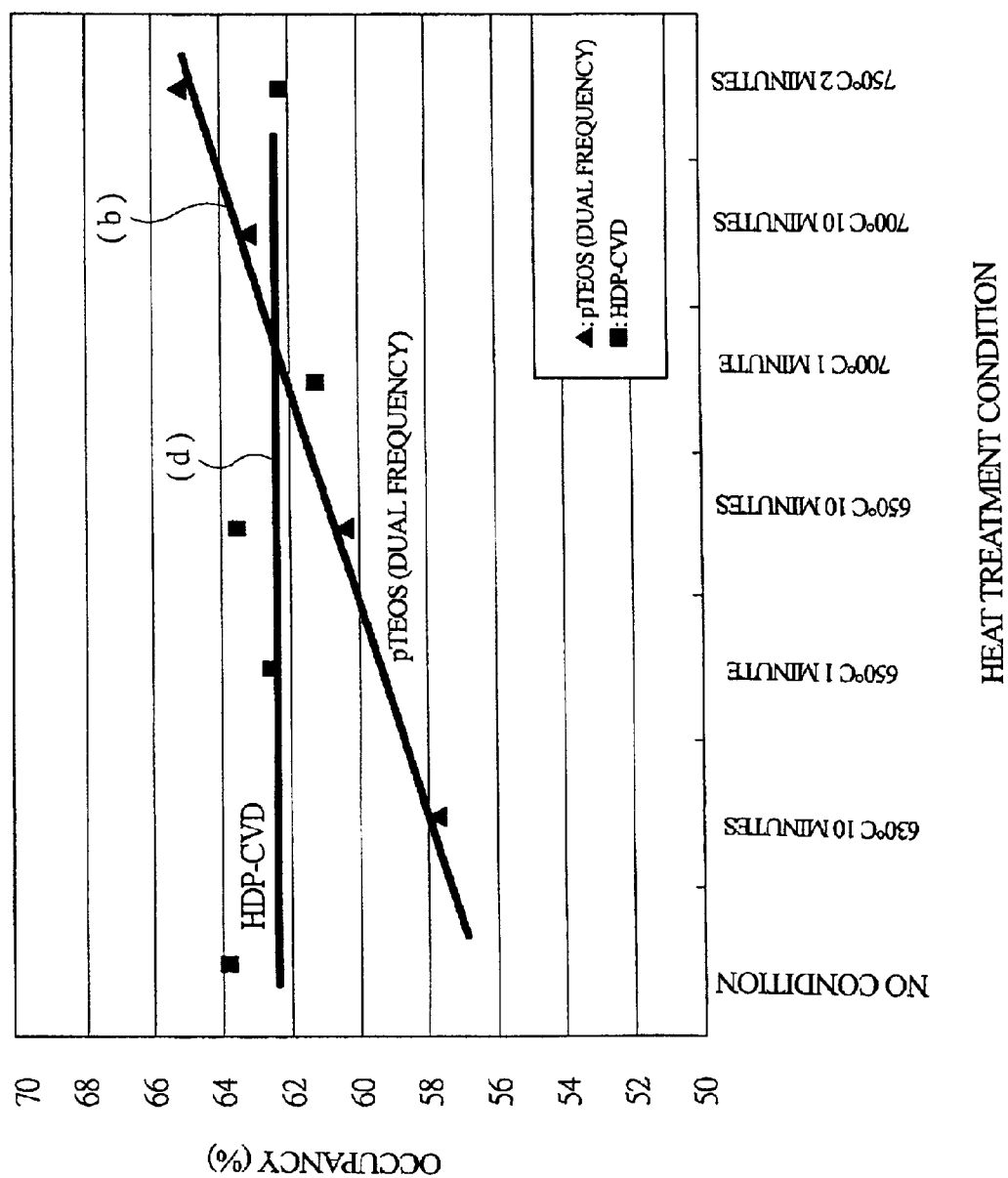
FIG. 10 shows graphs for explaining the results obtained in the embodiment of the present invention.

FIG. 10 shows how much the silicon grains are grown when the heat treatment under different conditions is performed to each of the films, that is, the film of the graph (b) formed by the plasma CVD method using two plasmas of high and low frequencies with using tetraethoxysilane as a material thereof, and the film of the graph (d) formed by the high-density plasma CVD method at a temperature of 600° C. with using monosilane as a material thereof. The occupancy (%) of the vertical axis represents how much the silicon grains (43b) occupy the surface of the silicon film (amorphous silicon film 43a). This occupancy can be obtained by means of the image recognition of the silicon grains and the image processing thereof.

As shown by the graph (b) in FIG. 10, in the case of the film formed by the plasma CVD method using two plasmas of high and low frequencies with using tetraethoxysilane as a material thereof, the higher the temperature of the heat treatment becomes, the higher the occupancy becomes. Also, when the heat treatment is performed while setting the temperature constant, the longer the time of the subsequent heat treatment becomes, the higher the occupancy becomes.

On the other hand, in the case of the film formed by the high-density plasma CVD method at a temperature of 600° C. with using monosilane as a material thereof, the occupancy of about 63% can be obtained regardless of the temperature and the time of the heat treatment, and the occupancy of the same degree can be obtained even if the heat treatment is not performed. Therefore, in the case of the film formed by the high-density plasma CVD method at a temperature of 600° C. with using monosilane as a material thereof, it is possible to obtain the occupancy of 60% or more even if the subsequent heat treatment is not performed.

Figure 11:
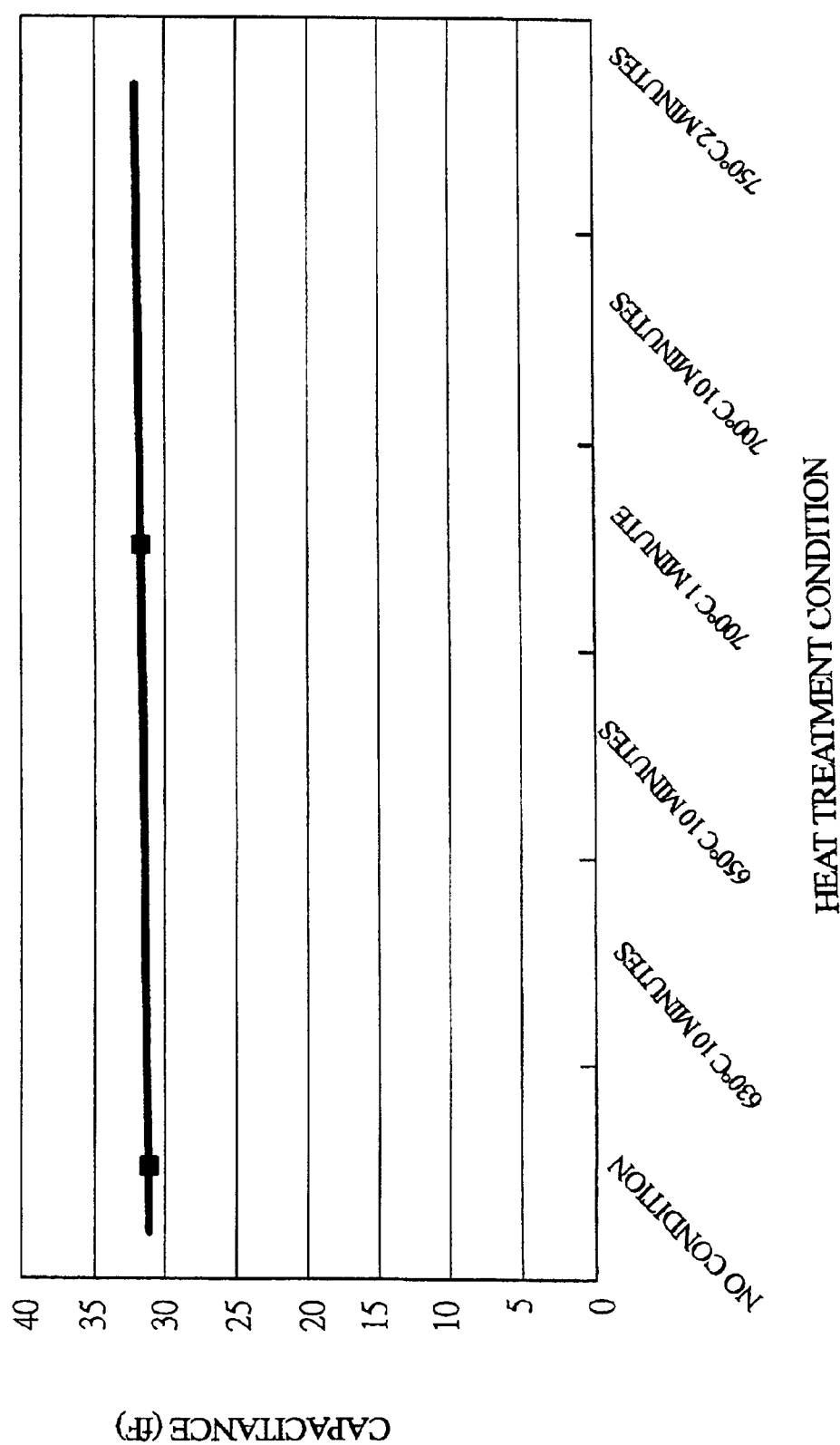
FIG. 11 shows graphs for explaining the results obtained in the embodiment of the present invention.

FIG. 11 shows the capacitances in the case where the later described capacitor insulating film and upper electrode are formed on each of the films shown in the graph (d) in FIG. 9. As shown in FIG. 11, in the case of the film formed by the high-density plasma CVD method at a temperature of 600° C. with using monosilane as a material thereof, the capacitance of 30 fF or more can be obtained even if the subsequent heat treatment is not performed. The capacitance thus obtained is approximately equal to that obtained after performing the heat treatment at a temperature of 700° C. and for 1 minute. Therefore, in the case of the film formed by the high-density plasma CVD method at a temperature of 600° C. with using monosilane as a material thereof, it is possible to obtain the capacitance of 30 fF or more even if the subsequent heat treatment is not performed.

Figure 12:
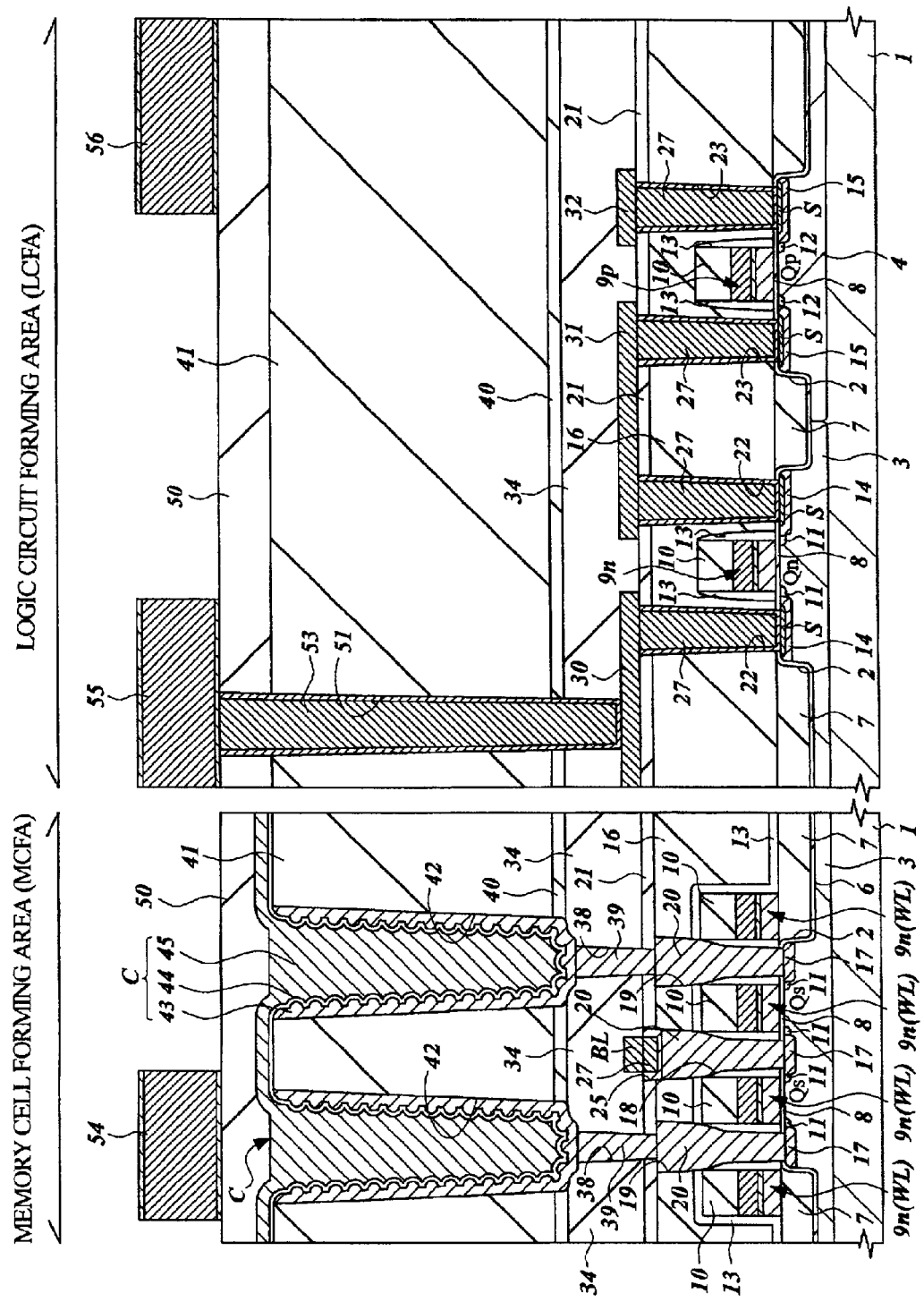
FIG. 12 is a cross-sectional view showing the principal part of the substrate illustrating the manufacturing method of a semiconductor integrated circuit device according to the first embodiment of the present invention.

Next, the steps of forming a capacitor insulating film and an upper electrode will be described. As shown in FIG. 12, after depositing a tantalum oxide ($Ta_2O_5$) film 44 to a thickness of about 10 nm on the silicon oxide film 41 and in the trench 42 by the CVD method, the heat treatment is performed at a temperature of about 650° C. to 750° C. in an oxidizing atmosphere to crystallize the tantalum oxide film 44. The tantalum oxide film 44 is used as the capacitor insulating film of the capacitor C.

Next, a TiN film 45 is deposited to a thickness of about 100 nm on the tantalum oxide film 44 and in the trenches 42 by using the CVD method and the sputtering method together. Thereafter, the TiN film 45 and the tantalum film 44 are dry-etched with using a resist film (not shown) as a mask. By so doing, a capacitor C constituted of an upper electrode composed of the TiN film 45, a capacitor insulating film composed of the tantalum oxide film 44, and a lower electrode composed of the polycrystalline silicon film 43 is formed. At the end of the steps described above, a DRAM memory cell formed of the MISFET Qs for data transfer and the capacitor C connected in series thereto is completed.

Next, a silicon oxide film 50 is deposited on the capacitor C by the CVD method. Subsequently, the silicon oxide films 50 and 41, the silicon nitride film 40, and the silicon oxide film 34, which are formed on the first wiring 30 in the logic circuit forming area, are subjected to the dry etching to form a through hole 51. Thereafter, a plug 53 is formed in the through hole 51 in the same manner as that of the plug 27.

Next, second wirings 54 to 56 are formed on the silicon oxide film 50 and the plug 53. Subsequently, third wirings are formed on the second wirings 54 to 56 via a silicon oxide film, and then, a protection film composed of a silicon oxide film and a silicon nitride film is deposited on the third wirings. However, illustration of them is omitted. At the end of the steps described above, the DRAM according to the embodiment has been almost completed.

Note that in this embodiment, a heat treatment is not performed after forming the silicon oxide film 41 and before forming the amorphous silicon film 43a. However, it is also possible to perform a heat treatment, for example, at a temperature of about 700° C. for about 10 seconds.

(Second Embodiment)

In the first embodiment, the silicon oxide film 41 is formed by the high-density plasma CVD method using monosilane ($SiH_4$) and oxygen as materials. However, the silicon oxide film having a two-layer structure may be formed as described later.

The manufacturing method of a semiconductor integrated circuit device according to the second embodiment will be described with reference to FIGS. 13 and 14. Note that the steps until the plug 39 in the silicon oxide film 34 is formed are the same as those in the first embodiment described with reference to FIGS. 1 to 4. Therefore, the description thereof will be omitted.

Figure 13:
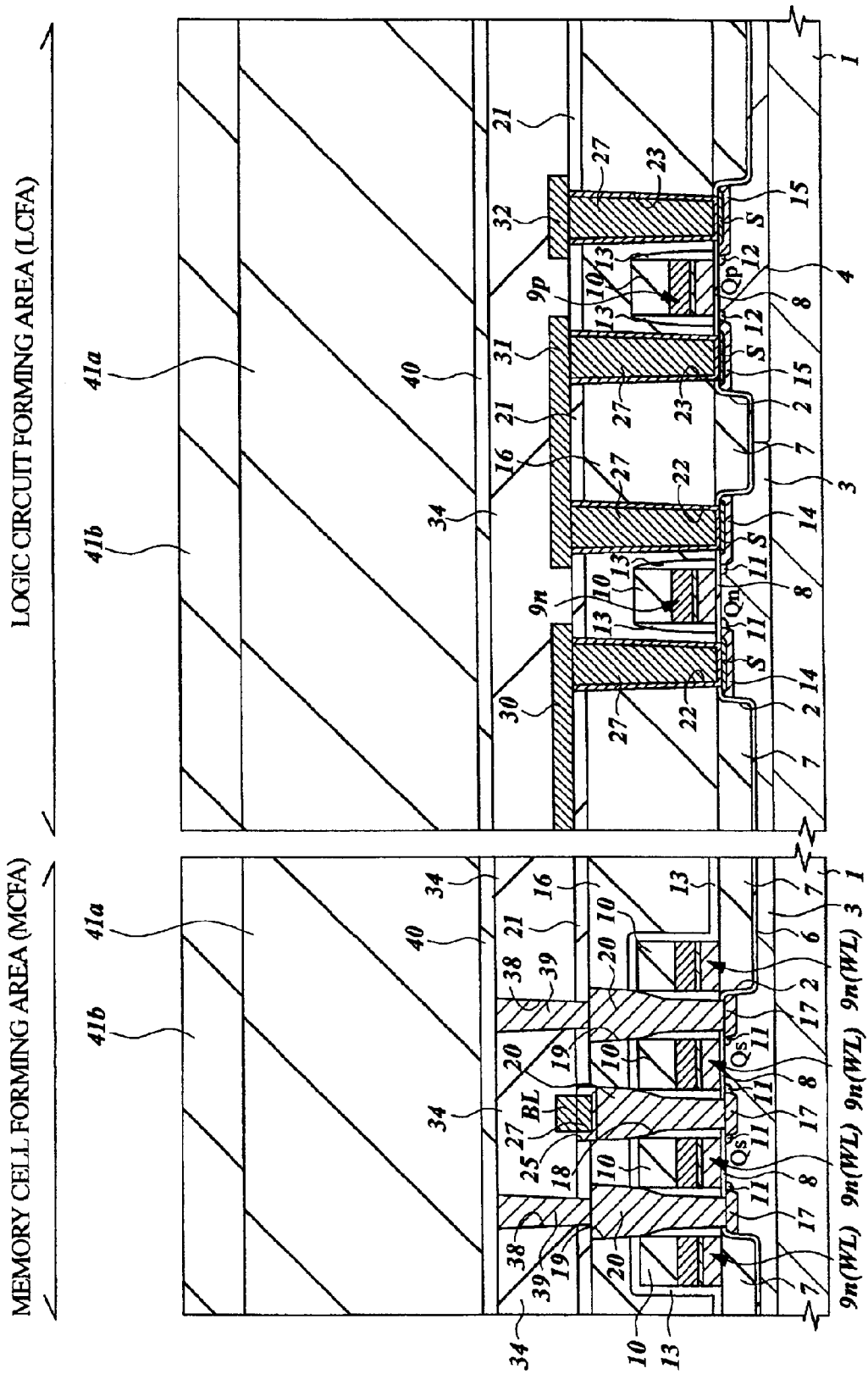
FIG. 13 is a cross-sectional view showing the principal part of a substrate illustrating a manufacturing method of a semiconductor integrated circuit device according to the second embodiment of the present invention.

As shown in FIG. 13, a silicon nitride film 40 is deposited to a thickness of about 100 nm on the silicon oxide film 34 and the plug 39 by the CVD method. Subsequently, a silicon oxide film 41a is deposited to a thickness of about 0.5 to 2.0 μm on the silicon nitride film 40 by the CVD method. Next, a silicon oxide film 41b is deposited to a thickness of 100 nm or more on the silicon oxide film 41a.

This silicon oxide film 41b is formed by the CVD method using monosilane ($SiH_4$) and oxygen as materials. Deposition temperature in this case is set to about 450° C. to 700° C.

Figure 14:
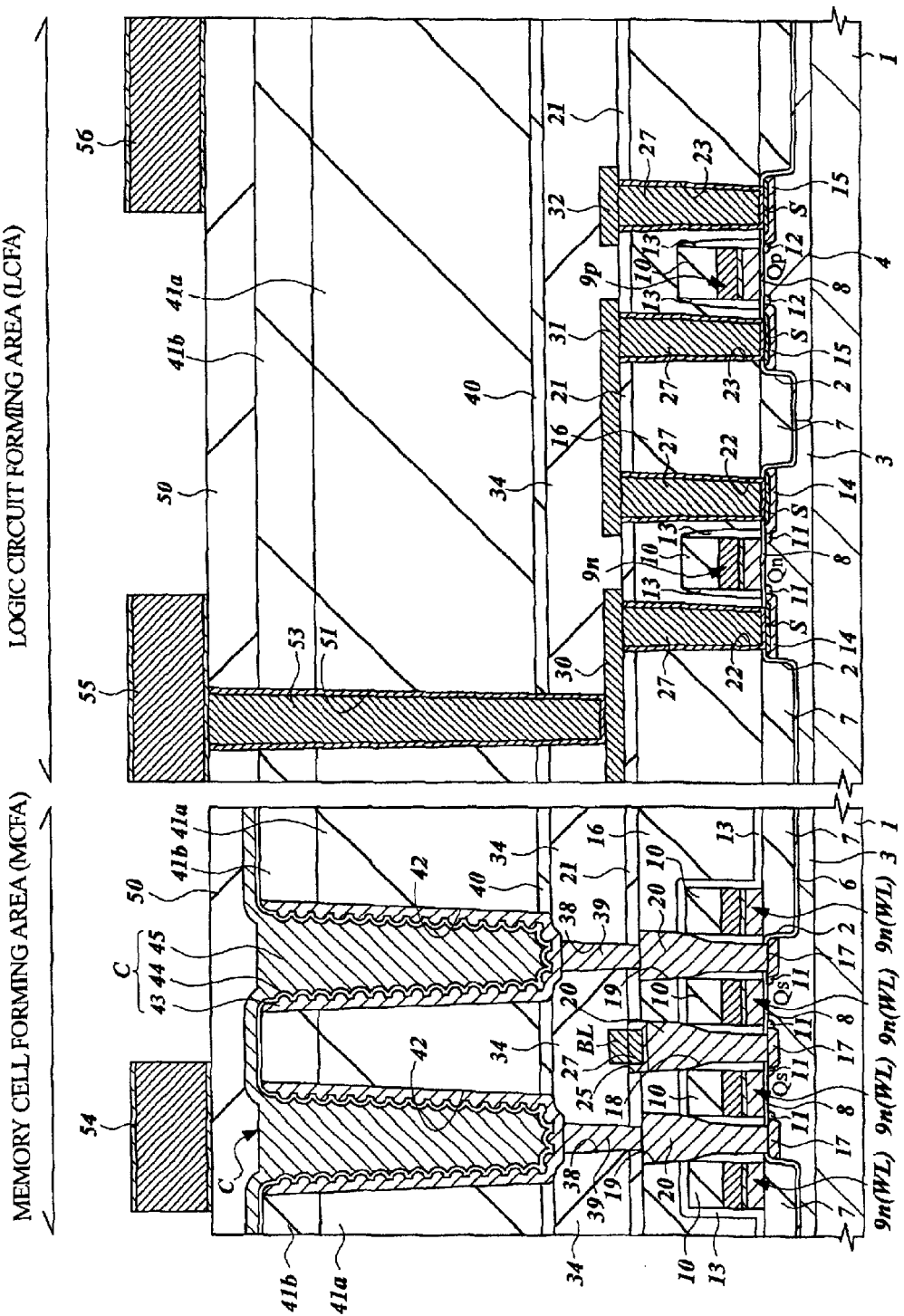
FIG. 14 is a cross-sectional view showing the principal part of the substrate illustrating the manufacturing method of a semiconductor integrated circuit device according to the second embodiment of the present invention.

Next, as shown in FIG. 14, the silicon oxide films 41a and 41b and the silicon nitride film 40 below them are dry-etched, and thereby forming trenches 42 above the plug 39.

Next, similar to the first embodiment, the lower electrode composed of the polycrystalline silicon film 43, the capacitor insulating film composed of the tantalum oxide film 44, and the upper electrode composed of the TiN film 45 are formed.

Further, the silicon oxide film 50, the plug 53, and the second wirings 54 to 56 are formed in the same manner as that in the first embodiment.

As described above, according to the second embodiment, the silicon oxide film 41b having the capacitor C formed on the surface thereof is formed by the plasma CVD method at a high temperature of 450° C. to 700° C. Therefore, it is possible to form the silicon oxide film 41b with small moisture and impurity content. As a result, the degassing from the silicon oxide films 41a and 41b, particularly, the amount of gas emitted from the upper surfaces thereof can be reduced as described in the first embodiment. Therefore, the degassing does not hinder the growth of the silicon grains, and the sufficient surface area of the polycrystalline silicon film 43 can be obtained.

Also, according to this embodiment, the heat treatment step for removing the moisture or the like after forming the silicon oxide films 41a and 41b can be omitted. In other words, it is possible to reduce the amount of time required for the heat treatment and to lower the heat treatment temperature. As a result, advantages as described in the first embodiment can be obtained. More specifically, the deterioration of properties of the MISFETs can be prevented and, in particular, the leakage amount of boron can be reduced.

Further, according to this embodiment, only the silicon oxide film 41b is formed by the CVD method at a high temperature of about 450° C. to 700° C. Therefore, the peeling and breaking of the wiring (e.g., bit line BL and first wirings 30 to 32) due to the membrane stress can be reduced. More specifically, if a detailed film with small moisture content is formed thinly, the membrane stress is increased and the peeling and breaking of the wirings are prone to occur. However, according to this embodiment, it is possible to avoid such a problem.

In addition, when the high-density plasma CVD apparatus is used, since the apparatus itself is expensive, if the processing time using the apparatus is long, the product cost is increased. However, since the high-density plasma CVD apparatus is used only in the step of forming the silicon oxide film 41b in this embodiment, the product cost can be reduced.

(Third Embodiment)

In the above first and second embodiments, the present invention is applied to the silicon oxide film on which the capacitor C is formed. However, it is also possible to apply the present invention to the interlayer insulating film containing impurities such as phosphorus as described below.

Figure 15:
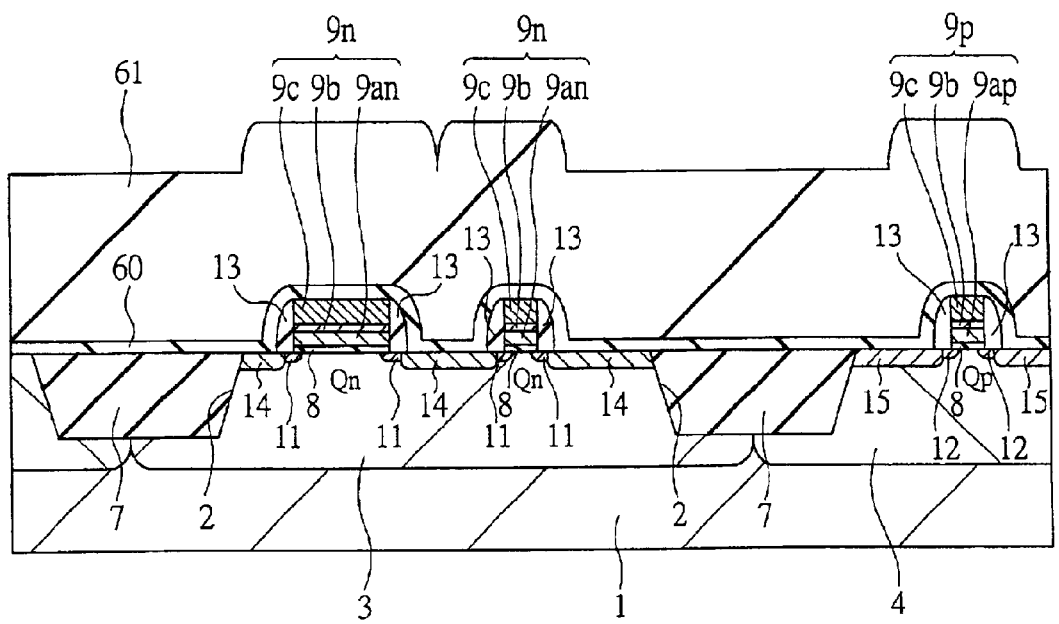
FIG. 15 is a cross-sectional view showing the principal part of a substrate illustrating a manufacturing method of a semiconductor integrated circuit device according to the third embodiment of the present invention.

FIG. 15 is a cross-sectional view showing the principal part of a substrate illustrating a manufacturing method of a semiconductor integrated circuit device according to the third embodiment of the present invention.

The n channel MISFET Qn and the p channel MISFET Qp shown in FIG. 15 can be made in the same manner as those of the MISFETs Qn and Qp described in the first embodiment. Therefore, the description thereof will be omitted.

As shown in FIG. 15, a silicon nitride film 60 is deposited on the n channel MISFET Qn and the p channel MISFET Qp. This silicon nitride film 60 functions as an etching stopper when forming a contact hole on the source and drain regions (n$^+$ type semiconductor region 14 and p$^+$ type semiconductor region 15). A plug is formed in the contact hole.

Subsequently, a silicon oxide film 61 to which impurities such as phosphorus (P) are added is deposited on the silicon nitride film 60. The impurities are contained in the silicon oxide film 61 as described above because the impurities function to capture the contaminants such as heavy metal during the manufacturing process so as to protect the device such as the MISFET (so-called gettering).

The silicon oxide film 61 containing impurities is formed by the high-density plasma CVD method using the gas containing monosilane (SiH$_4$), oxygen, and phosphorus as a material. The deposition temperature at this time is set to about 450° C. to 700° C.

As described above, in this embodiment, the silicon oxide film 61 to which impurities such as phosphorus (P) are added is formed by the plasma CVD method at a high temperature of 450° C. to 700° C. Therefore, it is possible to form the silicon oxide film 61 with small moisture content and by-product content created during the film formation.

Therefore, the subsequent heat treatment step for removing the moisture and the by-product contained in the silicon oxide film 61 can be omitted, or it is possible to reduce the amount of time required for the heat treatment and to lower the heat treatment temperature. As a result, the deterioration of properties of the MISFET can be prevented.

Especially, when impurities such as phosphorus (P) are contained in the silicon oxide film, the heat treatment after forming the film becomes important because of its high hygroscopicity. In the case where this heat treatment is performed after forming the film, the heat treatment at a high temperature and for a long time (e.g., 700 to 900° C. and 10 seconds to 30 minutes) is required. If the heat treatment at a high temperature and for a long time like this is performed, the concentration profiles of the semiconductor regions constituting the MISFET are changed, and as a result, it becomes impossible to maintain the desired properties as described in the first embodiment. Especially, the boron (B) implanted into the p type gate electrode 9p is prone to diffuse and its property is lost easily.

Contrary to this, in this embodiment, the moisture and the by-product can be removed during the film formation. And thus, the heat treatment for removing the moisture or the like after forming the silicon oxide film 61 can be omitted. In other words, it is possible to reduce the amount of time required for the heat treatment and to lower the heat treatment temperature.

Consequently, since it is possible to reduce the heat load, the deterioration of properties of the MISFETs (Qn and Qp) can be prevented, especially, the leakage amount of boron in the p type gate electrode 9p can be reduced.

Thereafter, the plug and the like are formed in the silicon oxide film 61, and further, the first wiring is formed thereon. However, the illustration and the detailed description thereof will be omitted.

(Fourth Embodiment)

In the third embodiment, the silicon oxide film 61 is formed as a single layer. However, the silicon oxide film having a two-layer structure may be formed as described below.

Figure 16:
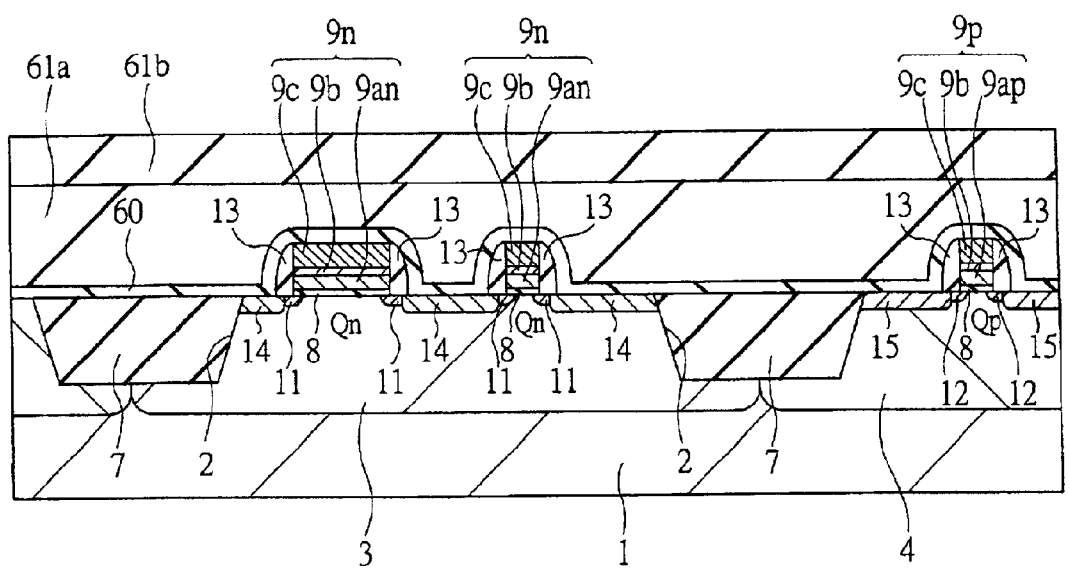
FIG. 16 is a cross-sectional view showing the principal part of a substrate illustrating a manufacturing method of a semiconductor integrated circuit device according to the fourth embodiment of the present invention.

FIG. 16 is a cross-sectional view showing the principal part of a substrate illustrating a manufacturing method of a semiconductor integrated circuit device according to the fourth embodiment of the present invention.

The n channel MISFET Qn and the p channel MISFET Qp shown in FIG. 16 can be made in the same manner as those of the MISFETs Qn and Qp described in the first embodiment. Therefore, the description thereof will be omitted.

As shown in FIG. 16, a silicon oxide film 61a is deposited above the n channel MISFET Qn and the p channel MISFET Qp by the CVD method. Note that if the high-density plasma CVD method is used here, the etching by the high-density plasma is performed simultaneously with the deposition of the deposition material (silicon oxide in this case). Therefore, the silicon oxide can be properly embedded even in the fine trenches with a narrow width.

Next, the surface of the silicon oxide film 61a is polished by the CMP method to planarize the same.

Subsequently, a silicon oxide film 61b to which impurities such as phosphorus (P) are added is deposited on the silicon oxide film 61a. The impurities are contained in the silicon oxide film 61b for the purpose of the gettering as described in the third embodiment.

The silicon oxide film 61b containing impurities is formed by the high-density plasma CVD method using the gas containing monosilane (SiH$_4$), oxygen, and phosphorus as a material. The deposition temperature at this time is set to about 450° C. to 700° C.

As described above, the silicon oxide film 61b containing impurities on the MISFET is formed by the plasma CVD method at a high temperature of 450° C. to 700° C. Therefore, it is possible to form the silicon oxide film 61b with small moisture and by-product content.

Therefore, similar to the third embodiment, the heat treatment step for removing the moisture and the by-product contained in the silicon oxide film 61b can be omitted, or it is possible to reduce the amount of time required for the heat treatment and to lower the heat treatment temperature. As a result, the deterioration of properties of the MISFET can be prevented.

Also, in the case where the silicon oxide film is polished by the use of chemical solution like in the CMP method, if the silicon oxide film containing impurities is polished directly, the heat treatment for removing the moisture and the like must be performed at a higher temperature and for a longer time due to its high hygroscopicity. Consequently, the heat load is further increased.

However, in this embodiment, after the silicon oxide film 61a is deposited to cover the bumps of the MISFETs (Qn and Qp), the silicon oxide film 61a is planarized. Thereafter, the silicon oxide film 61b containing impurities is formed. By so doing, it becomes possible to avoid the problem as described above.

In addition, since the interlayer insulating film is constituted of the silicon oxide films 61a and 61b, the membrane stress can be reduced as described in the second embodiment. Therefore, the peeling and breaking of the wiring (including gate electrode) can also be reduced.

In the foregoing, the invention made by the inventors thereof has been concretely described based on the embodiments. However, the present invention is not limited to the embodiments. It goes without saying that various changes and modifications can be made within the scope of the present invention.

Particularly, the high-density plasma CVD is employed in the first to fourth embodiments. However, it is also possible to perform the foregoing processes by using the plasma CVD and the thermal CVD together.

The advantages achieved by the typical ones of the inventions disclosed in this application will be briefly described as follows.

An insulating film is formed on a MISFET of a memory cell composed of the MISFET and a capacitor formed on a main surface of a semiconductor substrate by the plasma CVD method at a temperature of 450° C. to 700° C., and a silicon film for constituting a lower electrode of the capacitor is formed on the insulating film. Therefore, it is possible to increase the surface area of the silicon film and to sufficiently obtain the capacitance. It is also possible to reduce the load due to the heat treatment for removing the moisture and impurities in the insulating film, and thus, the deterioration of the properties of the MISFET can be prevented. Especially, in the case where the MISFETs of dual gate structure are formed around the memory cell, the properties of the MISFETs can be improved.

Also, a MISFET is formed on a main surface of a semiconductor substrate and an insulating film containing impurities is formed on the MISFET by plasma the CVD method at a temperature of 450° C. to 750° C. Therefore, the load due to the heat treatment for removing the moisture and the by-product in the insulating film can be reduced, and thus, the deterioration of the properties of the MISFET can be prevented.

What is claimed is:

1. A manufacturing method of a semiconductor integrated circuit device comprising a memory cell formed of a MISFET and a capacitor formed on a main surface of a semiconductor substrate, said method comprising the steps of:
    (a) forming said MISFET on the main surface of said semiconductor substrate;
    (b) forming an insulating film above said MISFET by a high density the plasma CVD method at a temperature of 450° C. to 700° C.;
    (c) forming a trench by etching said insulating film;
    (d) depositing a silicon film on said insulating film and in said trench, filling said trench by a photoresist, then etching back said silicon film on said insulating film and removing the silicon film from said insulating film to leave the silicon film only on an inner surface of said trench;
    e) forming a rugged surface silicon film on said silicon film on said inner surface of said trench to form a lower electrode of said capacitor on the inner wall of the trench; and
    f) forming a dielectric film on said rugged surface silicon film and on said insulating film and forming a plate electrode on said dielectric film.

2. The manufacturing method of a semiconductor integrated circuit device according to claim 1, wherein said rugged surface silicon film is formed by crystal grains which are grown from crystal nucleuses of silicon deposited on said silicon film.

3. The manufacturing method of a semiconductor integrated circuit device according to claim 1,
    wherein said semiconductor integrated circuit device has an area in which said memory cell is formed and a second area in which a logic circuit is formed, and said manufacturing method of a semiconductor integrated circuit device comprises, before said step (b), the step of:
        (e) forming, in said second area in which a logic circuit is formed, an n channel MISFET and a p channel MISFET constituting said logic circuit, each of said n channel MISFET and said p channel MISFET comprising a gate electrode containing n type impurity and a gate electrode containing p type impurity, respectively.

4. A manufacturing method of a semiconductor integrated circuit device comprising a memory cell including a MISFET and a capacitor formed on a main surface of a semiconductor substrate, said method comprising the steps of:
    (a) forming said MISFET on the main surface of said semiconductor substrate;
    (b) depositing a first insulating film above said MISFET at a first temperature;
    (c) depositing a second insulating film on said first insulating film at a second temperature between 450° C. and 700° C. that is higher than said first temperature by a high-density plasma CVD method,
    (d) forming a trench by etching said first and second insulating films;
    (e) depositing a silicon film on said second insulating film and in said trench, filling said trench by a photoresist, then etching back said silicon film on said second insulating film and removing the silicon film on said second insulating film to leave the silicon film only on an inner surface of said trench;
    f) forming a rugged surface silicon film an said silicon film on said inner surface of said trench to form a lover electrode of said capacitor on the inner wall of the trench; and
    (g) forming a dielectric film on said rugged surface silicon film and on said second insulating film and forming a plate electrode on said dielectric film.

5. The manufacturing method of a semiconductor integrated circuit device according to claim 4,
    wherein said semiconductor integrated circuit device has a first area in which said memory cell is formed and a second area in which a logic circuit is formed, and said manufacturing method of a semiconductor integrated circuit device comprises, before said step (b), the step of:
        (h) forming, in said second area in which a logic circuit is formed, an n channel MISFET and a p channel MISFET constituting said logic circuit, each of said n channel MISFET and said p channel MISFET comprising a gate electrode containing n type impurity and a gate electrode electrode containing p type impurity, respectively.

6. A manufacturing method of a semiconductor integrated circuit device, comprising the steps of:
    (a) forming a MISFET on a main surface of a semiconductor substrate;
    (b) forming a plug connected with said MISFET through a first insulating film which has a substantially planarized surface;
    (c) forming a second insulating film containing impurity over said first insulating film by a high-density plasma CVD method at a temperature of 450° C. to 700° C.;
    (d) forming a trench by etching said second insulating film;
    (e) depositing a silicon film on said second insulating film and in said trench, filling said trench by a photoresist, then etching back said silicon film on said second insulating film, and removing the silicon film on said second insulating film to leave the silicon film only on an inner surface of said trench;

(f) forming a rugged surface silicon film on said silicon film to form a lower electrode of a capacitor on the inner wall of the trench; and (g) forming a dielectric film on said rugged surface silicon film and on said second insulating film and forming a plate electrode on said dielectric film.

7. The manufacturing method of a semiconductor integrated circuit device according to claim 6, wherein said impurity is phosphorus.

8. A manufacturing method of a semiconductor integrated circuit device, comprising the steps of:

(a) forming a MISFET on a main surface of a semiconductor substrate;

(b) depositing a first insulating film above said MISFET at a first temperature;

(c) planarizing a surface of said first insulating film;

(d) forming a second insulating film containing impurity on said first insulating film at a second temperature higher than said first temperature by a high-density plasma CVD method;

(e) forming a trench by etching said first and second insulating films;

(f) depositing a silicon film on said second insulating film and in said trench, filling said trench by a photoresist, then etching back said silicon film on said second insulating film, and removing the silicon film on said second insulating film to leave the silicon film only on an inner surface of said trench;

(g) forming a rugged surface silicon film on said silicon film on said inner surface of said trench to form a lower electrode of a capacitor on the inner wall of the trench; and (h) forming a dielectric film on said rugged surface silicon film and on said second insulating film and forming a plate electrode on said dielectric film.

9. The manufacturing method of a semiconductor integrated circuit device according to claim 8, wherein said impurity is phosphorous.

10. The manufacturing method of a semiconductor integrated circuit device according to claim 8, wherein said first and second insulating films are formed by the CVD method using high-density plasma.

* * * * *